United States Patent
Deng et al.

(12) 
(10) Patent No.: US 6,744,804 B2
(45) Date of Patent: Jun. 1, 2004

(54) EDGE EMITTING LASERS USING PHOTONIC CRYSTALS

(75) Inventors: Hongyu Deng, Arcadia, CA (US); Thomas Lenosky, Mountain View, CA (US); Jan Lipson, Cupertino, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/197,997

(22) Filed: Jul. 18, 2002

(65) Prior Publication Data

US 2004/0013156 A1 Jan. 22, 2004

(51) Int. Cl.[7] ............................................. H01S 3/081
(52) U.S. Cl. ........................................ 372/92; 372/50
(58) Field of Search ............................... 372/29.02, 92, 372/96; 359/321, 237, 248; 343/912; 385/15; H01S 5/10

(56) References Cited

U.S. PATENT DOCUMENTS

| | | | | |
|---|---|---|---|---|
| 5,617,445 A | * | 4/1997 | Jewell | 372/96 |
| 5,684,817 A | | 11/1997 | Houdre et al. | |
| 5,751,466 A | * | 5/1998 | Dowling et al. | 359/248 |
| 5,990,850 A | * | 11/1999 | Brown et al. | 343/912 |
| 6,028,693 A | * | 2/2000 | Fork et al. | 359/248 |
| 6,560,006 B2 | * | 5/2003 | Sigalas et al. | 359/321 |
| 6,574,383 B1 | * | 6/2003 | Erchak et al. | 385/15 |
| 2002/0314194 | * | 10/2002 | Nobuhiko | |

OTHER PUBLICATIONS

Dae–Sung Song, et al., *Single–Fundamental–Mode Photonic–crystal Vertical–cavity surface–emitting Lasers*, Applied Physics Letters, vol. 80, No. 21, May 27, 2002, pp. 3901–3903.

\* cited by examiner

*Primary Examiner*—Paul Ip
*Assistant Examiner*—Tuan N. Nguyen
(74) *Attorney, Agent, or Firm*—Workman Nydegger

(57) ABSTRACT

An edge emitting laser that emits a single mode using photonic mirrors. An edge emitting laser includes an active region that is formed between an n-type semiconductor material and a p-type semiconductor material. Photonic mirrors are formed in the laser to define a gain cavity and an external cavity. The gain cavity is bounded by a cleaved facet and a photonic mirror or by a pair of photonic mirrors. The external cavity is bounded by the photonic mirror of the gain cavity and either a cleaved facet or another photonic mirror. The mode emitted by the laser is determined by characteristics of the photonic mirrors, including the periodic cavity structures of the mirrors.

18 Claims, 2 Drawing Sheets

EDGE EMITTING LASERS USING PHOTONIC CRYSTALS

BACKGROUND OF THE INVENTION

1. The Field of the Invention

The present invention relates to edge emitting semiconductor lasers. More particularly, the present invention relates to single mode edge emitting semiconductor lasers using photonic crystals as mirrors.

3. Background and Relevant Art

Semiconductor lasers are often used as light sources in optical communication systems. The light emitted by a semiconductor laser is generated when photons stimulate the emission of additional photons in the gain medium or active region of the semiconductor laser. The gain medium is typically bounded by cleaved facets, which function as mirrors to reflect photons through the active region. The facets of the laser are usually parallel to each other and form a cavity that is called a Fabry-Perot cavity.

Optical amplification occurs in a Fabry-Perot cavity as light is. reflected back and forth between the facets through the gain medium. The cavity typically has resonant wavelengths, and for these resonant wavelengths, the reflected light adds in phase. The combination of adequate facet reflectivity and amplifier gain causes the laser to lase at resonant wavelengths. Although single mode behavior is desirable, many lasers often exhibit multimode behavior. Multimode is undesirable for applications such as communication systems that are modulated at high speeds. In particular, multimode behavior limits the usable bandwidth because of intensity noise and because different modes travel at different velocities in an optical fiber.

Single mode edge emitting lasers include distributed feedback (DFB) lasers and distributed Bragg reflector (DBR) lasers. DFB and DBR edge emitting lasers are created using a series of reflectors or a grating such as a Bragg reflector. The corrugation of the Bragg reflector can occur within and/or without the gain medium. In a DBR laser, the corrugation occurs outside of the gain medium. In a DFB laser, the corrugation occurs within the active region. The Bragg reflector or corrugation suppresses some of the modes of the laser while amplifying a particular mode.

Fabricating a DFB or DBR laser is usually performed using epitaxial regrowth, which is often expensive and can lead to decreased yield when the lasers are fabricated. In addition, DFB lasers are sensitive to where the facets are cleaved with respect to the grating or corrugation. Because the facet cleaving cannot be precisely controlled, the lasers fabricated in this manner can have variations in their performance. Because some of the lasers are discarded, the overall laser yield decreases and the cost per usable laser increases.

BRIEF SUMMARY OF THE INVENTION

These and other limitations are overcome by the present invention which relates to light emitting sources, such as edge emitting lasers, that generate single mode output using photonic crystals as mirrors. As previously stated, Fabry-Perot lasers that emit light at multiple wavelengths or modes are problematic for various applications including long distance optical communication. The present invention achieves single mode behavior, for example, by using photonic crystals as mirrors in the edge emitting laser. In one embodiment, the gain cavity and/or the external/coupled cavity is defined by the photonic mirrors instead of cleaved facets. In accordance with the present invention, photonic mirrors are used in external or coupled cavity lasers and in short cavity lasers, or any combination thereof.

Photonic crystals or materials function as the mirrors of an edge emitting laser to reflect light through the laser cavities. Photonic crystals have a photonic bandgap and are reflective for certain wavelengths. These photonic mirrors are thus arranged such that a single mode is generated or emitted by the edge emitting laser. Exemplary embodiments of the present invention that include photonic crystals to emit a single mode include, but are not limited to, external or coupled cavity lasers and short cavity lasers.

In one embodiment, a single mode is emitted because the reflectivity of the photonic mirrors is dependent on the wavelength of the light. The photonic mirror regions of the edge emitting laser can be designed with respect to a particular wavelength such that the particular wavelength is reflected while other wavelengths are not reflected as well as the particular wavelength. The wavelengths that are not reflected do not have appreciable gain. The photonic mirrors ensure that wavelengths within the photonic band gap have appreciable gain.

In another embodiment, photonic crystals are used to form an external cavity or coupled cavity edge emitting laser. The photonic mirror regions are arranged to create a single mode emission from the edge emitting laser. In this example, the photonic mirror regions define a pair of cavities a gain cavity and an external or coupled cavity. In an external cavity embodiment, the second cavity does not have a gain medium. In a coupled cavity embodiment, both cavities may be pumped to generate laser light and the coupled cavity may include a gain medium.

In another embodiment of a coupled cavity or external cavity edge emitting laser, two photonic mirror regions may be used, while retaining single mode operation. In this example, the external or coupled cavity is bounded by the photonic mirrors while the gain cavity is bounded by a cleaved facet and a photonic mirror. Alternatively, the gain cavity is bounded by the photonic mirrors while the external cavity is bounded by one of the photonic mirrors and a cleaved facet. In another embodiment, a single photonic mirror is used to separate the gain cavity and the coupled or external cavity.

In yet another embodiment, photonic crystals can be used to create short cavity lasers. Typically, short cavity lasers are difficult to fabricate because the location of the cleaved facet is difficult to control. Fabricating short cavity lasers is also difficult because semiconductor materials are rather brittle and hard to cut, which presents mechanical difficulties when cleaving a laser. Photonic crystals can be more precisely placed such that a short cavity edge emitting laser is formed.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

An edge emitting laser is essentially a pn junction between an n-type semiconductor material and a p-type semiconductor material. An active region is usually formed at the pn junction. The active region has a smaller band gap than the surrounding n-type and p-type semiconductor materials. As a result, the carriers combine more efficiently in the active region when the edge emitting laser is forward biased.

The present invention achieves single mode emission using photonic crystals in various configurations. For example, single mode behavior can be achieved in the resonance of a gain cavity and an external or coupled cavity using photonic crystals to define the gain cavity and the external or coupled cavity. The wavelength dependence of the reflectivity of the photonic crystals results in single mode behavior. Also, short cavity lasers, which have well separated modes, can be fabricated using photonic crystals. In these embodiments, photonic crystals are used to reflect light or photons through the active region. In some embodiments, photonic crystals and/or cleaved facets are used as the mirrors.

Figure 1:
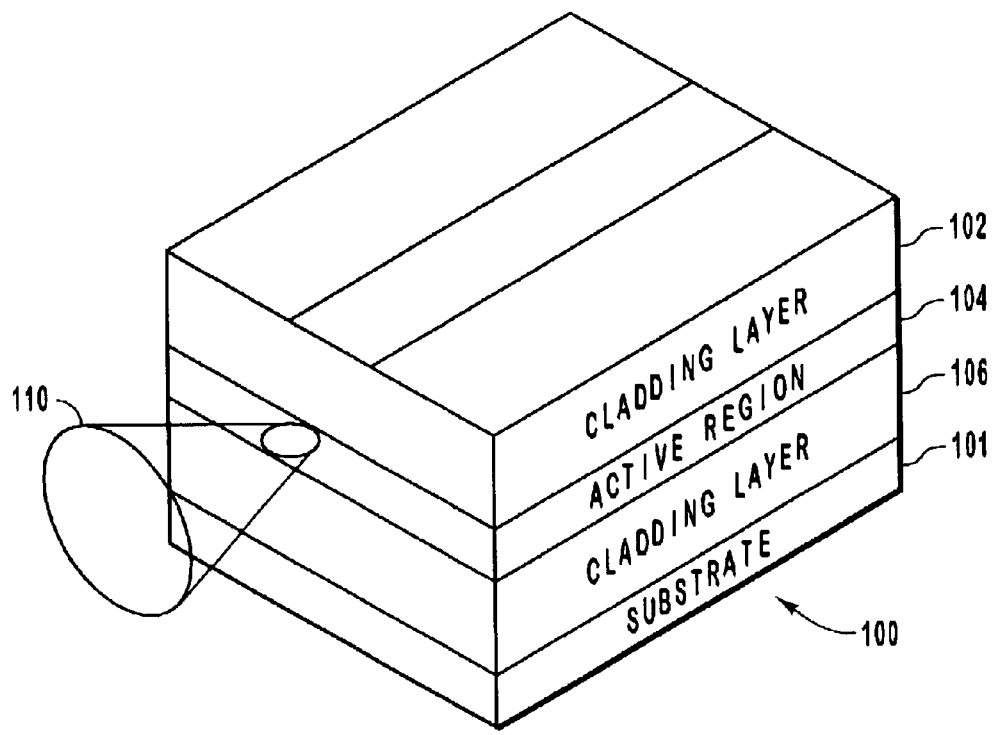
FIG. 1 is a perspective view of an edge emitting laser that illustrates an active region formed between cladding layers.

FIG. 1 is a perspective view of the general structure of an edge emitting laser before the photonic crystals or mirrors are formed or placed in the edge emitting laser 100. The edge emitting laser 100 has a pair of cladding layers 102 and 104 on either side of an active region 104, which contains a gain medium. One of the cladding layers is typically an n-type semiconductor material and the other cladding layer is a p-type semiconductor material. The edge emitting laser 100 has a substrate 101, upon which other layers are formed or grown.

The cladding layers 102 and 106 typically have an index of refraction that is lower than the index of refraction of the active region. This confines the light to the active region 104. The active region 104 is also usually bounded by cladding material in the plane of the active region 104. Thus, the light is optically confined within the active region 104. The laser light 110 generated by the laser 100 typically has multiple modes or wavelengths.

By including a photonic crystal or mirror in the structure of an edge emitting laser, the edge emitting laser can take advantage of the photonic band gap. The photonic band gap relates to the frequencies or wavelengths of light that are reflected by the photonic crystal. In other words, the photonic crystals or mirrors arc used to reflect light through the active region to stimulate the emission of photons. The photonic mirrors can be formed in various locations of the edge emitting laser. Thus, embodiments of the present invention include, but are not limited to, light sources with a gain cavity, coupled cavity edge emitting lasers, external cavity edge emitting lasers, and short cavity edge emitting lasers.

A photonic crystal or layer is a material, such as a semiconductor material or a dielectric material that can be deposited in a thin film, that has cavities or holes or other structure that are subsequently formed in the material. The cavities or apertures are usually organized in a periodic cavity structure and the periodic cavity structure of the photonic crystal has an impact on the photonic band gap. The ability to alter the cavity structure enables the wavelength of the mode emitted by the laser to be altered as required.

Figure 2:
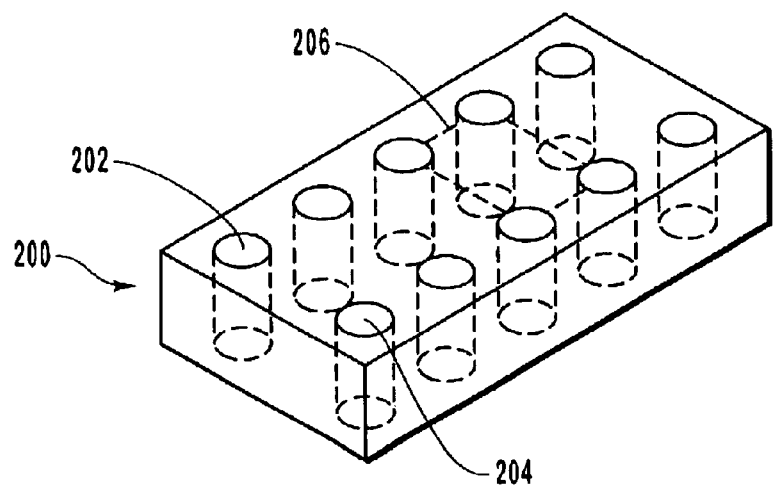
FIG. 2 is a perspective view of a photonic crystal.

FIG. 2 illustrates an exemplary photonic crystal 200. In the photonic crystal 200, a plurality of cavities are formed or structured in the photonic crystal 200 and form a periodic cavity structure. The holes or cavities 202 and 204 are examples of the cavities that are thus formed in the photonic crystal 200. Each cavity typically passes through the photonic crystal 200 to form a hole or void. This photonic crystal 200 thus has a perforated quality in this example. It is also possible for the cavity structure to be formed such that the photonic crystal 200 is not perforated by cavities. Instead the photonic crystal will have a dimpled surface. In another embodiment, the cavities will extend into other layers of the laser.

The cavities are formed or placed in the photonic crystal 200 using an appropriate cavity structure that can vary according to design and to the desired photonic band gap. The distance between cavities in the structure is often on the order of optical wavelengths. In some instances, the distance between cavities is related to the wavelength of laser light that is generated by an edge emitting laser. The cavity structures described herein are not limited to optical wavelengths, but optical wavelengths are used herein as an example of the distance between cavity structures in a photonic crystal.

As previously stated, the cavities or holes that arc formed in a photonic crystal are usually periodic in nature. The dashed line 206 illustrates a square cavity structure in the photonic crystal illustrated in FIG. 2. Other cavity structures include, but are not limited to, a rhombic cavity structure, a triangular cavity structure, a honeycomb cavity structure, a line cavity structure, a diamond cavity structure, other geometric structure, and the like or any combination thereof.

Similarly, each cavity or hole can be formed in different shapes and geometries. The cross sectional shapes of the holes or cavities include, but are not limited to, a circular shape, a triangular shape, a square shape, or any other geometric shape. The cavities 202 and 204 of this example are circular in nature. The cavities can also be formed in the photonic crystal 200 at angles such that the cavities are not normal with respect to the surface of the photonic crystal 200. In addition, the cavities may not pass completely through the photonic layer, but may form a dimpled surface. Alternatively, the cavities may have a depth that extends into the active region or other layers of the laser.

Figure 3:
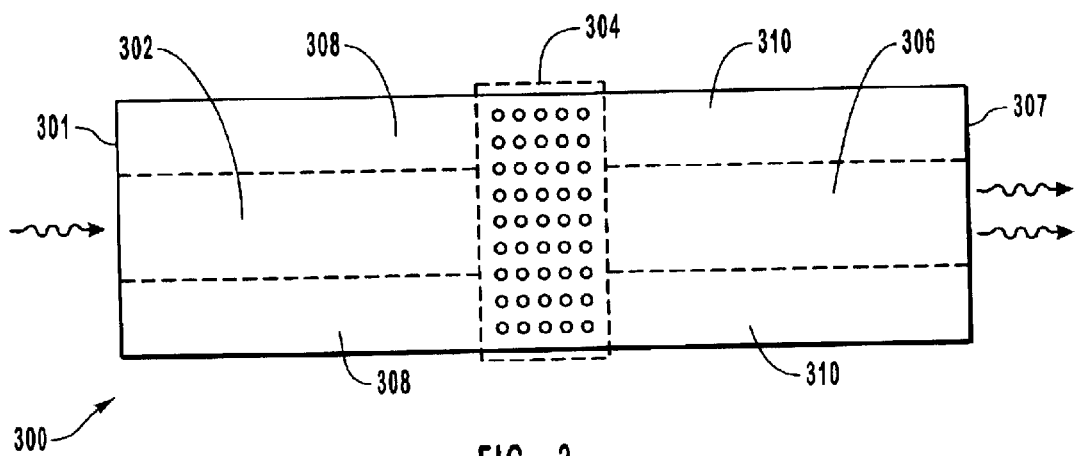
FIG. 3 is a block diagram of an edge emitting laser with a photonic mirror between a gain cavity and an external cavity.

FIG. 3 illustrates a top view of an edge emitting laser in accordance with one embodiment of the present invention.

The laser 300 has cleaved facets 301 and 307, which act as mirrors. The laser 300 also includes a photonic mirror 304 between the facets 301 and 307. This structure thus forms a pair of resonating cavities the gain cavity 302 between the facet 301 and the photonic mirror 304 and the external cavity 306 between the photonic mirror 304 and the facet 307.

The gain cavity 302 between the photonic mirror 304 and the facet 301 typically has a gain medium such as quantum wells, for example. The external cavity 306 can be designed to be, for example, a coupled cavity or an external cavity. An external cavity does not impart gain while a coupled cavity provides additional gain. In both cases, the modes generated by the laser 300 are reduced because the generated modes are subject to both the gain cavity 302 and the external cavity 306.

The gain cavity 302 has resonant wavelengths that are determined in part by the photonic mirror 304. The wavelengths that are outside of the photonic band gap are not reflected by the photonic mirror 304 and do not have appreciable gain. The photonic mirror 304 has a reflectivity or photonic band gap that can be specific to a narrow range of frequencies or wavelengths.

The reflectivity of the photonic mirror 304 can be affected by a number of different factors that include, but are not limited to, the geometry (shape, depth, diameter, etc.) of the cavities, the periodic cavity structure, the composition of the photonic mirror, the thickness of the photonic mirror, the depth of the cavities in the photonic mirror, and the like or any combination thereof. In addition, FIG. 3 illustrates that the photonic mirror 304 has a square cavity structure that is repeated for four periods. The reflectivity of the photonic mirror 304 can also be affected by the number of periods in the cavity structure of the photonic mirror 304.

Figure 4:
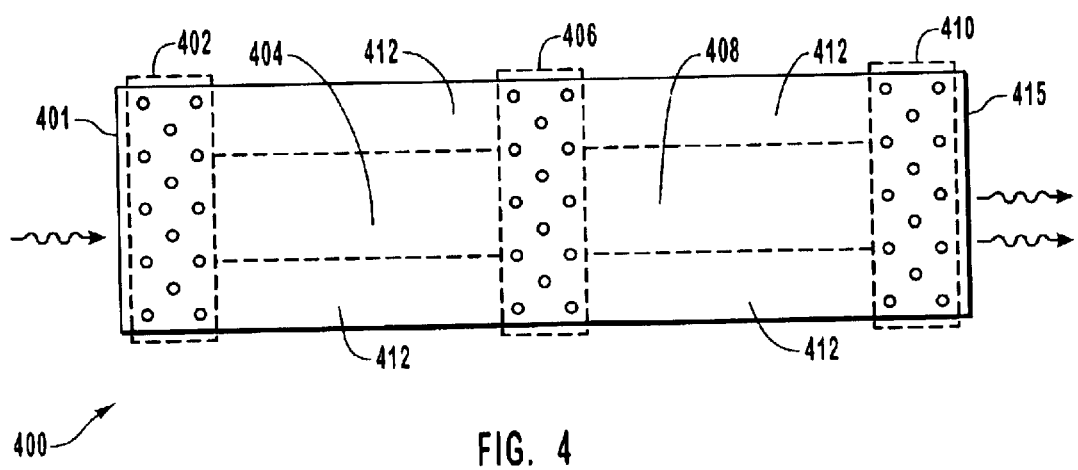
FIG. 4 is a block diagram of an edge emitting laser where the gain cavity and the external or coupled cavity are bounded by photonic mirrors.

FIG. 4 illustrates a top view of another embodiment of an edge emitting laser in accordance with the present invention. In this example, there are three photonic mirrors or photonic mirror regions. The gain cavity 404 is formed between the photonic mirror 402 and the photonic mirror 406, while the coupled or external cavity 408 is formed between the photonic mirror 406 and the photonic mirror 410. As described previously, the mode generated by the laser 400 is a resonant mode of both the gain cavity 404 and the external cavity 408. The reflectivity of the photonic mirrors 402, 406, and 410 and the presence of both a gain cavity and an external cavity ensures that a specific wavelength of light is able to have sufficient gain to lase, while other modes or wavelengths of light do not have appreciable gain.

In another embodiment, the photonic mirror 402 is not included in the laser structure of FIG. 4. Thus, the gain cavity 404 would exist between a facet 401 and a photonic mirror 406 while the external cavity 408 is between a pair of photonic mirror 406 and the photonic mirror 410. In another embodiment, the photonic mirror 410 is not present and the gain cavity is between the photonic mirror 402 and the photonic mirror 406, while the external or coupled cavity is between the photonic; mirror 406 and the cleaved facet 415.

One advantage of the present invention is that single mode behavior is not necessarily dependent on the reflectivity of the photonic mirrors. In FIG. 4, for example, the single mode may be primarily achieved by the gain cavity 404 and the external cavity 408. The photonic mirrors enable the length of the gain cavity 404 and the external cavity 408 to be more precisely formed because the length of the gain cavity 404 and the external cavity 408 are not as precisely formed when relying on the cleaved facets.

In another embodiment, single mode behavior is directly related to the photonic mirrors. Each photonic mirror has a photonic band gap, which refers to frequencies that are reflected by the photonic mirror. Thus, the photonic mirror is able to reflect frequencies of interest and the photonic mirrors of the laser can be designed or formed such that the laser lases in a particular mode. There is no requirement that all of the photonic mirrors have the same cavity structure. Rather, the photonic mirrors can be configured such that a single mode is emitted by the laser 400.

Photonic mirrors can also be used to create short cavities. One advantage of a short cavity laser is that the threshold current is reduced when compared to the threshold current of a longer cavity laser. Also, the speed of the laser is increased because the capacitance is reduced. As the cavity of a laser is made shorter, the mode spacing increases. This enables, for example, two photonic mirrors to be used while retaining single mode emission. Photonic crystals facilitate the fabrication of short cavity lasers by eliminating the need to precisely control the creation of the cleaved facets.

Figure 5:
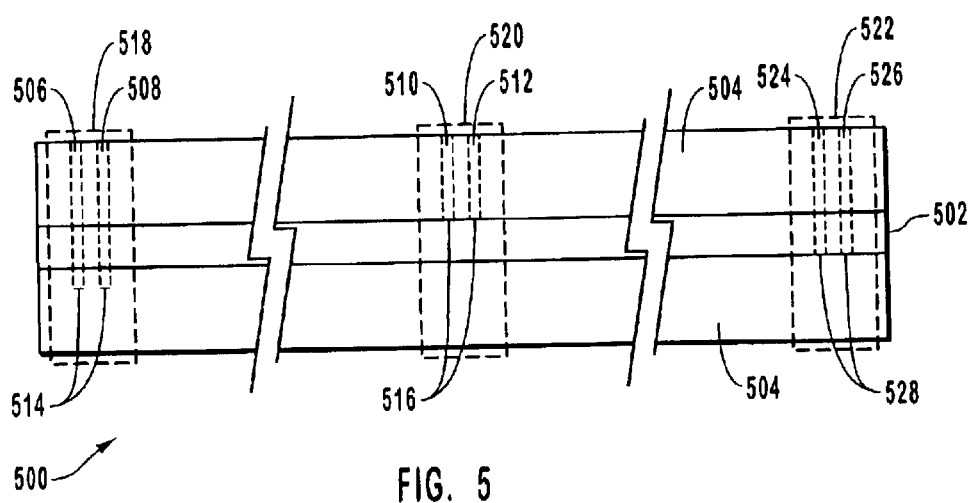
FIG. 5 is a block diagram illustrating the depth of the cavities formed in the photonic mirrors of the edge emitting crystal.

FIG. 5 illustrates a side view of an edge emitting laser and illustrates another aspect of the photonic crystals or mirrors. This example includes three photonic mirrors: photonic mirror 518, 520, and 522. Each photonic mirror has a periodic cavity structure and has reflectivity for the same or different frequencies. In FIG. 5, however, the cavities are illustrated as having different depths. In this example, the cavities 506 and 508 included in the photonic mirror 518 extend through the active region 502 and into the cladding 504 as illustrated by the depths 514. The cavities 510 and 512, however, do not extend into the active region 502, but extend through the upper cladding layer as illustrated by the depths 516. The cavities 524 and 526 penetrate both the upper cladding layer and the active region 502 as illustrated by the depths 528. However, there is no requirement that the cavities penetrate the active region. One advantage of penetrating the active region is that fewer periods of the photonic crystal are required. In the case where penetration of the active region introduces trap states, thus raising the threshold current of the edge emitting laser, the cavities can be surrounded by an insulating layer of insulating material, such as iron doped InP.

In FIG. 5, each photonic mirror includes a portion of each cladding layer and the active region that is effectively defined by the holes or cavities. In another example the photonic mirror is limited by the depth of the cavities. Thus, the photonic mirror may be limited to the upper cladding layer if the cavities do not penetrate the active region. Because the light is typically confined to the active region, the photonic mirrors are capable of reflecting a particular mode within the active region. The photonic mirrors are designed to emit a single mode, but it is possible to design the photonic mirrors such that more than one mode is emitted, if desired.

When a photonic mirror is formed, it is usually formed in the upper cladding layer because the cladding layer is formed first. Then, the holes or cavities are formed in the cladding layer. The depth of the cavities can vary according to the design of the laser. In one embodiment, the cavities or holes are often formed by electron beam lithography or other lithography technique. Regardless of the cavity depths, the photonic mirrors bound the gain cavity and/or the external cavity of the edge emitting crystal even if the cavities do not penetrate the active region.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An external cavity edge emitting laser that emits a single mode of laser light, the laser comprising:
   a lower cladding layer formed on a substrate;
   an active region formed on the lower cladding layer, a portion of the active region having a gain medium; and
   an upper cladding layer formed on the active region, wherein laser light is optically confined in the active region by the lower cladding layer and upper cladding layer;
   a first cavity bounded by a first photonic mirror having a periodic cavity structure and a second photonic mirror having a periodic cavity structure, the first cavity including the portion of the active region that has the gain medium;
   a second cavity bounded by the second photonic mirror and a third photonic mirror having a periodic cavity structure, wherein the first, second, and third photonic mirrors are configured to reflect a particular mode of light within the active region of the first and second cavity such that the particular mode of laser light has appreciable gain and other modes of laser light to not have appreciable gain.

2. An external cavity edge emitting laser as defined in claim 1, wherein the periodic cavity structure is one of: a square cavity structure, a triangular cavity structure, a rhombic cavity structure, and hexagonal cavity structure.

3. An external cavity edge emitting laser as defined in claim 1, wherein each cavity of the periodic cavity structures has a depth.

4. An external cavity edge emitting laser as defined in claim 3, wherein the depth of each cavity in each periodic cavity structure extends through the upper cladding layer without penetrating the active region.

5. An external cavity edge emitting laser as defined in claim 3, wherein the depth of each cavity extends into the active region.

6. An external cavity edge emitting laser as defined in claim 3, wherein the depth of each cavity extends through the active region.

7. An external cavity edge emitting laser as defined in claim 1, wherein the external second cavity includes a gain medium.

8. An external cavity edge emitting laser that emits a signal mode, the laser comprising:
   an active region formed at the junction of an upper cladding layer and a lower cladding layer, wherein light is optically confined to the active region by the upper cladding layer and the lower cladding layer, a portion of the active region having a gain medium;
   a first cavity that includes the portion of the active region having the gain medium, the first cavity being bounded by a first cleaved faced and a photonic mirror, the photonic mirror having a periodic hole structure and a photonic band gap related to a single mode of laser light; and
   a second cavity that includes a second portion of the active region, the second cavity being bounded by the photonic mirror and a second cleaved facet, the photonic mirror configured to reflect the single mode of laser light within the first and second cavity such that the single mode has appreciable gain in the first cavity.

9. A laser as defined in claim 8, wherein the gain medium further comprises a plurality of quantum wells.

10. A laser as defined in claim 8, wherein the periodic hole structure is on of:
    a square periodic structure;
    a triangular periodic structure;
    a rhombic periodic structure;
    a hexagonal periodic structure; and
    a geometric structure.

11. A laser as defined in claim 8, wherein each hole has a cross-sectional shape, which the cross-sectional shape is one of:
    a circular shape;
    a triangular shape;
    a square shape; and
    a geometric shape.

12. A laser as defined in claim 8, further comprising a second photonic mirror formed such that the second cavity is bounded by the first photonic mirror and the second photonic mirror.

13. A laser as defined in claim 8, wherein the second cavity includes a gain medium.

14. A laser as defined in claim 8, wherein the depth of each hole extends through the upper cladding layer and into the active region of the laser.

15. A laser as defined in claim 8, wherein the depth of each hole extends through both the upper cladding layer and through the active region.

16. A laser as defined in claim 8, wherein a second photonic mirror is formed such that the first cavity is bounded by the second photonic and the photonic mirror.

17. A short cavity edge emitting laser that emits a single mode, the laser comprising:
    a lower cladding layer formed on a substrate;
    an active region including a plurality of quantum wells, wherein the active region is formed on the lower cladding layer;
    an upper cladding layer formed on the active region, wherein light is optically confined in the active region by the lower cladding layer and the upper cladding layer;
    a first photonic mirror, the first photonic mirror having a periodic cavity structure, wherein each cavity in the periodic cavity structure has a depth that extends into at least the upper cladding layer;
    a second photonic mirror that is formed a certain distance from the first photonic mirror to form a short cavity bounded by the first photonic mirror and the second photonic mirror such that only a single mode has appreciable gain in the short cavity, wherein the second photonic mirror has a periodic cavity structure and wherein each cavity in the periodic cavity structure has a depth that extends into at least the upper cladding layer.

18. A laser as defined in claim 17, wherein the depth of each cavity in both the first photonic mirror and the second photonic mirror extend into the active region.

* * * * *

UNITED STATES PATENT AND TRADEMARK OFFICE
CERTIFICATE OF CORRECTION

PATENT NO. : 6,744,804 B2  Page 1 of 1
DATED : June 1, 2004
INVENTOR(S) : Deng et al.

It is certified that error appears in the above-identified patent and that said Letters Patent is hereby corrected as shown below:

Column 1,
Line 23, before "reflected back" change "is." to -- is --.

Column 2,
Line 29, change "cavities" to -- cavities: --.

Column 5,
Line 4, change "cavities" to -- cavities: --.
Line 56, change "photonic;" to -- photonic --.

Column 7,
Line 27, after "light" change "to" to -- do --.

Column 8,
Line 35, after "photonic" insert -- mirror --.

Signed and Sealed this

Twenty-eighth Day of March, 2006

JON W. DUDAS
*Director of the United States Patent and Trademark Office*